United States Patent
Liang et al.

(10) Patent No.: US 9,013,918 B2
(45) Date of Patent: Apr. 21, 2015

(54) TWO-TERMINAL MEMORY CELL AND SEMICONDUCTOR MEMORY DEVICE BASED ON DIFFERENT STATES OF STABLE CURRENT

(75) Inventors: Qingqing Liang, Lagrangeville, NY (US); Xiaodong Tong, Beijing (CN); Huicai Zhong, San Jose, CA (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 169 days.

(21) Appl. No.: 13/320,331

(22) PCT Filed: Aug. 10, 2011

(86) PCT No.: PCT/CN2011/078209
§ 371 (c)(1),
(2), (4) Date: Nov. 14, 2011

(87) PCT Pub. No.: WO2012/149703
PCT Pub. Date: Nov. 8, 2012

(65) Prior Publication Data
US 2012/0281468 A1  Nov. 8, 2012

(30) Foreign Application Priority Data

May 4, 2011 (CN) .......................... 2011 1 0114256

(51) Int. Cl.
*G11C 11/39* (2006.01)
*G11C 17/06* (2006.01)
*H01L 27/102* (2006.01)

(52) U.S. Cl.
CPC ............ *G11C 11/39* (2013.01); *G11C 2213/72* (2013.01); *G11C 2213/74* (2013.01); *G11C 17/06* (2013.01); *H01L 27/1027* (2013.01)

(58) Field of Classification Search
CPC .............. G11C 11/39; G11C 2213/72; G11C 2213/74; G11C 17/06; H01L 27/1027
USPC ..................... 365/71 O, 174, 180 X
See application file for complete search history.

(56) References Cited

U.S. PATENT DOCUMENTS 5,514,882 A * 5/1996 Shulman ....................... 257/105
5,535,156 A * 7/1996 Levy et al. ..................... 365/175

(Continued)

FOREIGN PATENT DOCUMENTS

CN  1604233 A  4/2005
CN  101777572 A  7/2010

OTHER PUBLICATIONS

International Search Report and Written Opinion for corresponding PCT Application No. PCT/CN2011/078209, dated Feb. 16, 2012, 7 pages.

*Primary Examiner* — Vanthu Nguyen
(74) *Attorney, Agent, or Firm* — Westman, Champlin & Koehler, P.A.

(57) ABSTRACT

A two-terminal memory cell includes a first P-type semiconductor layer, a first N-type semiconductor layer, a second P-type semiconductor layer, and a second N-type semiconductor layer arranged in sequence. A first data state may be stored in the memory cell by applying a forward bias, which is larger than a punch-through voltage $V_{BO}$, between the first P-type semiconductor layer and the second N-type semiconductor layer. A second data state may be stored in the memory cell by applying a reverse bias, which is approaching to the reverse breakdown region of the memory cell, between the first P-type semiconductor layer and the second N-type semiconductor layer. In this way, the memory cell may be effectively used for data storage.

4 Claims, 3 Drawing Sheets

(56) References Cited

U.S. PATENT DOCUMENTS

| | | | |
|---|---|---|---|
| 6,064,100 A * | 5/2000 | Wen | 257/390 |
| 6,128,216 A * | 10/2000 | Noble et al. | 365/154 |
| 7,002,829 B2 * | 2/2006 | Singh et al. | 365/96 |
| 7,195,959 B1 * | 3/2007 | Plummer et al. | 438/133 |
| 7,573,077 B1 * | 8/2009 | Ershov | 257/146 |
| 7,652,916 B2 * | 1/2010 | Shepard | 365/175 |
| 7,859,012 B1 * | 12/2010 | Ershov | 257/146 |
| 7,916,530 B2 * | 3/2011 | Shepard | 365/175 |
| 7,969,777 B1 * | 6/2011 | Cho et al. | 365/180 |
| 8,324,656 B1 * | 12/2012 | Gupta et al. | 257/107 |
| 2002/0100918 A1 * | 8/2002 | Hsu et al. | 257/200 |

* cited by examiner

TWO-TERMINAL MEMORY CELL AND SEMICONDUCTOR MEMORY DEVICE BASED ON DIFFERENT STATES OF STABLE CURRENT

CROSS-REFERENCE TO RELATED APPLICATION(S)

This application is a National Phase application of, and claims priority to PCT Application No. PCT/CN2011/078209, filed Aug. 10, 2011, entitled Semiconductor Device and Semiconductor Memory Device, which claims priority to Chinese Application No. 201110114256.1, filed on May 4, 2011, both the PCT application and Chinese application are incorporated herein by reference in their entireties.

TECHNICAL FIELD

The present application relates to the technical field of semiconductor, and specifically relates to a semiconductor device which can be used as a memory cell and a semiconductor memory device comprising an array of such memory cells.

BACKGROUND

Recently, great progress has been achieved in development of semiconductor memory devices such as DRAM (Dynamic Random Access Memory). Due to continuously increasing needs for miniaturized memory devices with mass capacity, integration density of memory cells in a memory device keeps increasing.

In high-density integration, it is advantageous to use two-port devices as memory cells. Particularly, in a matrix addressing memory device, respective memory cells are located at intersections of bit lines and word lines arranged in different directions, respectively. If the memory cell is a two-port device, connection(s) between the memory cell and the bit line and connection(s) between the memory cell and the word line will be simplified, which facilitates the high-density integration.

However, conventional two-port devices, such as phase-change resistors and ferroelectrics, are more or less problematic, e.g., large power requirements or incompatibility with the conventional Si semiconductor process, etc. In view of this, there is a need for a novel two-port semiconductor device which can be used as a memory cell.

SUMMARY

The present disclosure provides, among other things, a semiconductor device which can be used as a memory cell and a semiconductor memory device comprising an array of such memory cells. The semiconductor device is easy to manufacture and thus the manufacture cost can be reduced.

According to an embodiment, there is provided a semiconductor device serving as a memory cell. The semiconductor device may comprise: a first P-type semiconductor layer, a first N-type semiconductor layer, a second P-type semiconductor layer, and a second N-type semiconductor layer arranged in sequence.

Optionally, a first data state may be stored in the semiconductor device by applying a forward bias, which is larger than a punch-through voltage $V_{BO}$, between the first P-type semiconductor layer and the second N-type semiconductor layer.

Optionally, a second data state may be stored in the semiconductor device by applying a reverse bias, which is approaching to the breakdown region of the semiconductor device, between the first P-type semiconductor layer and the second N-type semiconductor layer.

According to a further embodiment, there is provided a semiconductor memory device. The memory device may comprise: an array of memory cells, wherein each memory cell comprises the above-described semiconductor device; a plurality of word lines arranged in a first direction; and a plurality of bit lines arranged in a second direction different from the first direction, wherein each memory cell is connected to a corresponding word line and a corresponding bit line.

Optionally, a first data may be written in a memory cell connected to a bit line and a word line by applying a forward bias, which is larger than the punch-through voltage $V_{BO}$, on the memory cell via the bit line and the word line.

Optionally, a second data may be written in a memory cell connected to a bit line and a word line by applying a reverse bias, which is approaching to the breakdown region of the memory cell, on the memory cell via the bit line and the word line.

Optionally, the data stored in a memory cell connected to a bit line and a word line may be read by applying a read bias, which is larger than a critical voltage Vcrit and less than the punch-through voltage $V_{BO}$, on the memory cell via the bit line and the word line. It may be determined that the first data is stored in the memory cell if a current flowing through the memory cell is relatively large, and it may be determined that the second data is stored in the memory cell if the current flowing through the memory cell is relatively small.

The semiconductor device according to the present disclosure has a simple structure and is easy to manufacture, and thus has a low manufacture cost. The semiconductor devices, if used as memory cells, can easily form a memory cell array because of their two-port characteristics. Therefore, the integration density of the memory cells in a semiconductor memory device can be improved.

BRIEF DESCRIPTION OF THE DRAWINGS

The foregoing and other objects, features, and advantages of the present disclosure will become apparent from following descriptions on embodiments thereof with reference to the drawings.

DETAILED DESCRIPTION

Figure 1:
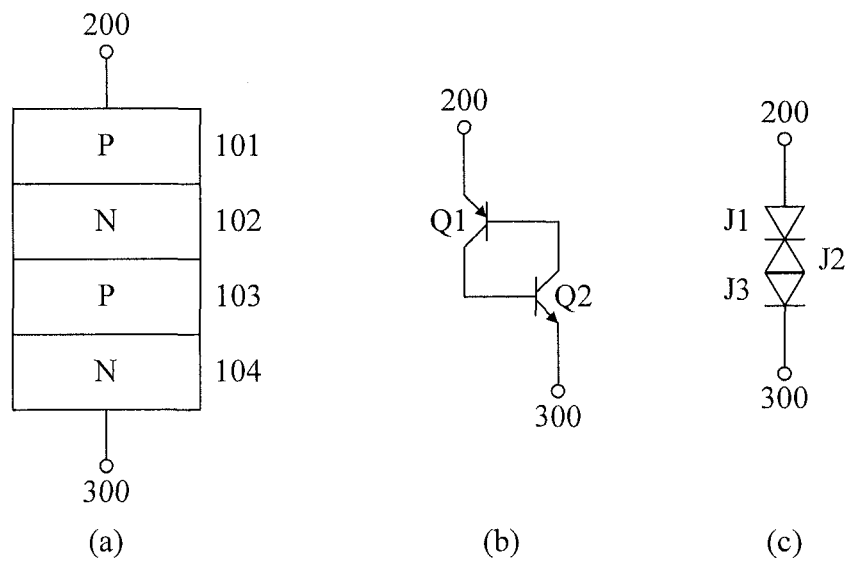
FIG. 1 schematically shows a structural diagram of a semiconductor device according to an embodiment of the present disclosure and equivalent circuit diagrams thereof.

Next, the present disclosure will be described with reference to specific embodiments shown in the drawings. However, it should be understood that those descriptions are just provided by way of example, rather than limiting the scope of the present disclosure. Further, in the following, descriptions on well-known knowledge and technology are omitted to avoid unnecessarily obscuring the concept of the present disclosure. It is to be noted that the drawings are not drawn to scale, wherein some details may be enlarged while some details may be omitted for sake of clarity.

FIG. 1 schematically shows a structural diagram of a semiconductor device according to an embodiment of the present disclosure and equivalent circuit diagrams thereof. As shown in FIG. 1(a), the semiconductor device according to the embodiment of the present disclosure comprises a first P-type semiconductor layer 101, a first N-type semiconductor layer 102, a second P-type semiconductor layer 103, and a second N-type semiconductor layer 104 arranged in this order. The first P-type semiconductor layer 101 (or a contact extending therefrom) forms an anode 200 of the semiconductor device; and the second N-type semiconductor layer 104 (or a contact extending therefrom) forms a cathode 300 of the semiconductor device. Therefore, the semiconductor device according to the embodiment forms a p-n-p-n semiconductor device having two terminals of the anode 200 and the cathode 300.

It is to be noted that FIG. 1 shows a structure where the first P-type semiconductor layer 101 is at the top side and the second N-type semiconductor layer 104 is at the bottom side. Those skilled in the art should understand that, opposite to the structure shown in FIG. 1, a structure where the second N-type semiconductor layer, the second P-type semiconductor layer, the first N-type semiconductor layer, and the first P-type semiconductor layer are arranged in this order from top to bottom is also possible.

For example, these semiconductor layers may comprise doped Si. In particular, the N-type semiconductor layers may be formed by doping Si with P, As, etc., and the P-type semiconductor layers may be formed by doping Si with B, In, etc., for example. Therefore, the semiconductor device according to the present disclosure is compatible with the conventional Si semiconductor process and thus is easy to manufacture. No special equipment is required and therefore the manufacture cost is reduced.

It should be understood that the material of the semiconductor layers is not limited to Si, but may comprise other semiconductor materials such as SiGe, SiC, etc. The dopants are not limited to those described above, but may comprise other N-type dopants (e.g., Sb) and other P-type dopants (e.g., Ga).

Here, components, dopant types, and dopant concentrations of the respective semiconductor layers need not be identical. For example, the first P-type semiconductor layer may comprise the dopant of B, and the second P-type semiconductor layer may comprise the dopant of In, and vice versa. The first N-type semiconductor layer may comprise the dopant of P, and the second N-type semiconductor layer may comprise the dopant of As, and vice versa. For example, the dopant concentration may be about $10^{16}$~$10^{21}$/cm$^3$.

The semiconductor device shown in FIG. 1(a) may be formed by depositing the second N-type semiconductor layer, the second P-type semiconductor layer, the first N-type semiconductor layer, and the first P-type semiconductor layer in this order, and patterning these layers by means of, for example, lithography. The layers each may have a thickness of about 1 nm~10 μm, and preferably about 10 nm~1 μm. Those skilled in the art can devise various ways to manufacture the semiconductor device having such a structure.

FIGS. 1(b) and 1(c) schematically show equivalent circuit diagrams of the semiconductor device shown in FIG. 1(a), respectively.

As shown in FIG. 1(b), the semiconductor device is equivalent to two transistors Q1 and Q2 connected together. In particular, the first P-type semiconductor layer 101, the first N-type semiconductor layer 102, and the second P-type semiconductor layer 103 compose a PNP-type transistor Q1. The first N-type semiconductor layer 102, the second P-type semiconductor layer 103, and the second N-type semiconductor layer 104 compose an NPN-type transistor Q2. The first P-type semiconductor layer 101 serves as an emitter of the transistor Q1, the first N-type semiconductor layer 102 serves as a base of the transistor Q1, and the second P-type semiconductor layer 103 serves as a collector of the transistor Q1. Further, the first N-type semiconductor layer 102 serves as a collector of the transistor Q2, the second P-type semiconductor layer 103 serves as a base of the transistor Q2, and the second N-type semiconductor layer 104 serves as an emitter of the transistor Q2.

As shown in FIG. 1(c), the semiconductor device may also be equivalent to three diodes (PN junctions) J1, J2, and J3 connected together. In particular, the first P-type semiconductor layer 101 and the first N-type semiconductor layer 102 form a first PN junction J1. The second P-type semiconductor layer 103 and the first N-type semiconductor layer 102 form a second PN junction J2, which has a direction opposite to that of the first PN junction J1. The second P-type semiconductor layer 103 and the second N-type semiconductor layer 104 form a third PN junction J3, which has a same direction as that of the first PN junction J1.

In the following descriptions, the equivalent circuit diagrams shown in FIG. 1(b) and FIG. 1(c) are used interchangeably. Namely, illustrations and descriptions on the circuit shown in FIG. 1(b) are also applicable to the circuit shown in FIG. 1(c), and vice versa.

Next, (DC) current-voltage characteristics of the semiconductor device shown in FIG. 1 will be described.

Figure 2:
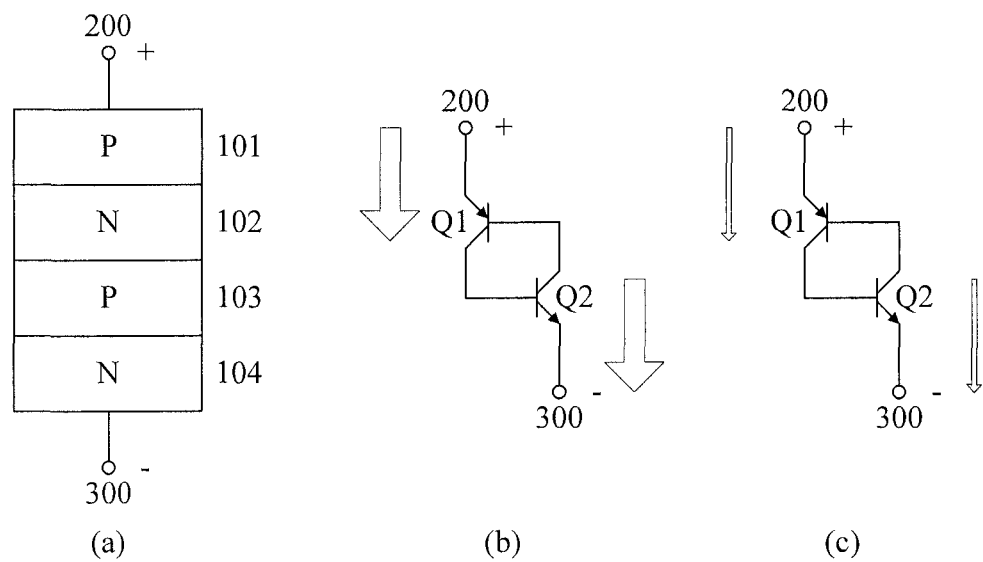
FIG. 2 schematically shows a current flowing through the semiconductor device with a forward bias applied between an anode and a cathode thereof.

FIG. 2 schematically shows a case where a forward bias is applied between the anode 200 and the cathode 300 (i.e., a potential of the anode 200 is higher than that of the cathode 300). When the forward bias voltage applied between the anode 200 and the cathode 300 is not very high, the first PN junction J1 and the third PN junction J3 are at a relatively small forward bias, while the second PN junction J2 is at a reverse bias and thus there is only a relatively small reverse current in the second PN junction J2. Here, that the forward bias voltage is not very high means that a product of current amplification ratios of Q1 and Q2 is less than 1 and thus there is no positive feedback. Therefore, a current between the anode 200 and the cathode 300 is relatively small, as shown in FIG. 2(c), where the current is indicated by an arrow.

When the forward bias voltage increases gradually, and in particular, when the forward bias voltage is larger than a critical voltage Vcrit, there may be two possibilities. One possibility is similar to the foregoing case where the forward bias voltage is low (in particular, less than the critical voltage Vcrit). Specifically, both the junction J1 and the junction J3 are still at a relatively small forward bias, and the product of the current amplification ratios of the transistor Q1 and the transistor Q2 is less than 1, so that the forward current of the whole p-n-p-n semiconductor device is still small. The other possibility is that at least one of the junction J1 and the junction J3 is at a relatively large bias, and the product of the current amplification ratios of the transistor Q1 and the transistor Q2 is larger than or equal to 1. As a result, a forward feedback is established and the forward current of the p-n-p-n semiconductor device is relatively large (see FIG. 2(b), wherein the current is indicated by an arrow). Therefore, there may be two states of stable current in the p-n-p-n semiconductor device at a same bias voltage, which can correspond to two storage states. A switch between the two states may be implemented by operations described below. According to the present disclosure, the two storage states can be used for data storage.

Theoretical analyses and experimental researches have shown that which of the two states to assume depends on whether charges accumulated in the device are sufficient to set at least one of the PN junctions at both ends (i.e., the junction J1 and/or the junction J3) at a forward bias state so as to establish a forward feedback. In particular, when the charges accumulated in the semiconductor device set at least one of the PN junctions at both ends at the forward bias, specifically, where holes are accumulated in the first P-type semiconductor layer 101 and electrons are accumulated in the first N-type semiconductor layer 102 such that the junction J1 is forward biased, and/or holes are accumulated in the second P-type semiconductor layer 103 and electrons are accumulated in the second N-type semiconductor layer 104 such that the junction J3 is forward biased, the device exhibits a relatively large stable current at a bias voltage between the critical voltage Vcrit and a punch-through voltage $V_{BO}$. However, when there are no accumulated charges in the semiconductor device, or the accumulated charges are not sufficient to forward bias the junction J1 and the junction J3, the device exhibits a relatively small stable current at the bias voltage between the critical voltage Vcrit and the punch-through voltage $V_{BO}$. For example, a large forward voltage pulse (e.g., larger than the punch-through voltage $V_{BO}$) may be applied to the device, so that sufficient charges will be accumulated in the device to forward bias the junction J1 and/or the junction J3.

When the forward bias voltage is larger than the punch-through voltage $V_{BO}$, the junction J1 and the junction J3 are at a relatively large forward bias, and the product of the current amplification ratios of Q1 and Q2 are always larger than or equal to 1. Therefore, the p-n-p-n semiconductor device will always in a conductive state having a large current.

Figure 3:
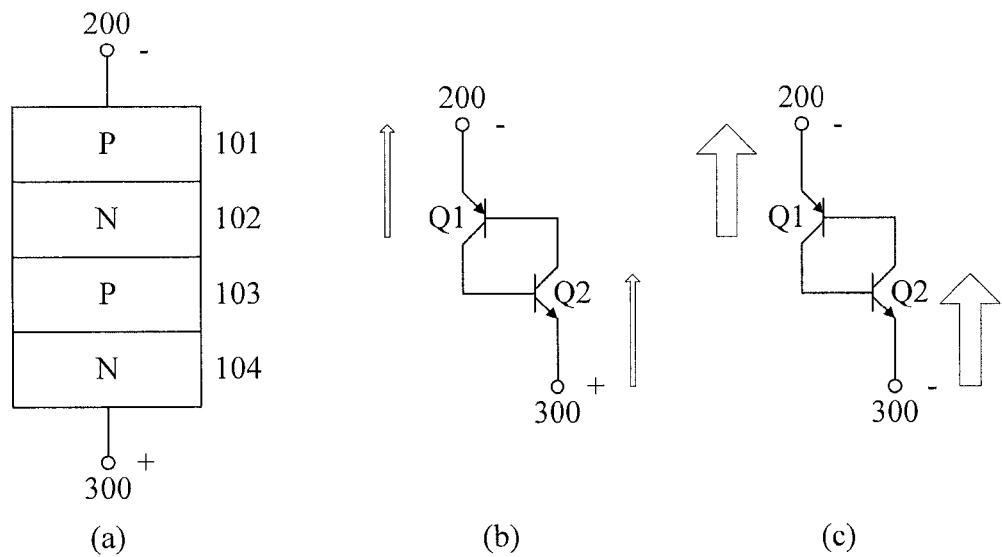
FIG. 3 schematically shows a current flowing through the semiconductor device with a reverse bias applied between the anode and the cathode thereof.

FIG. 3 schematically shows a case where a reverse bias is applied between the anode 200 and the cathode 300 (i.e., the potential of the anode 200 is less than that of the cathode 300). In such a case, the semiconductor device exhibits electrical characteristics similar to those of a reversely biased diode. In particular, when the reverse bias voltage is relatively low, there is only a relatively small reverse current between the anode 200 and the cathode 300, as shown in FIG. 3(b). However, when the reverse bias voltage increases to a certain extent, the current will increase abruptly, similarly to breakdown, as shown in FIG. 3(c).

Figure 4:
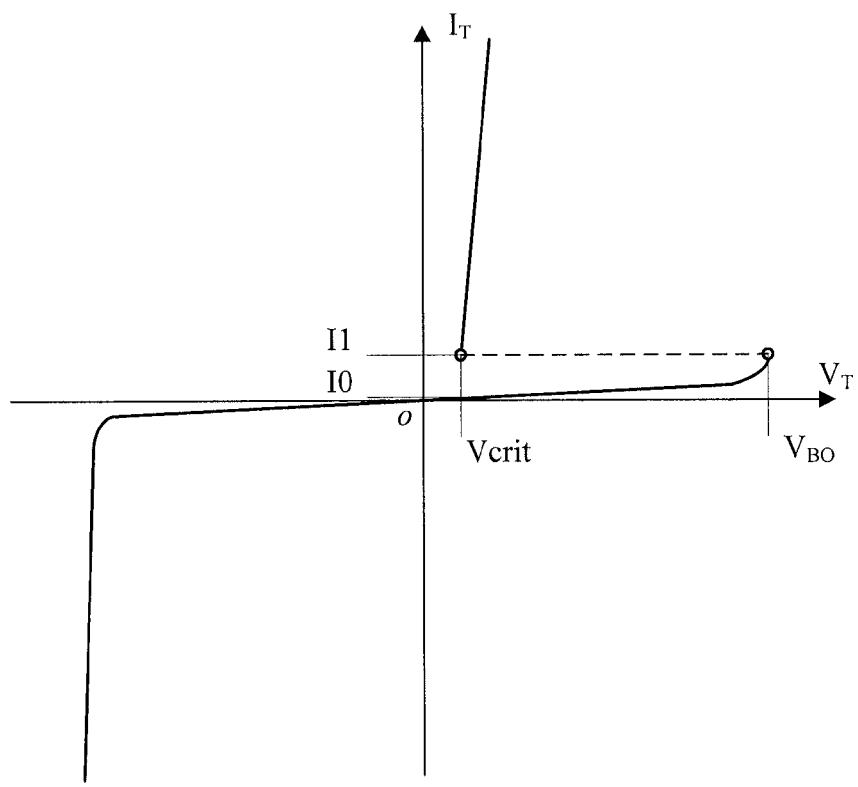
FIG. 4 schematically shows a current ($I_T$)–voltage ($V_T$) characteristic graph of the semiconductor device.

FIG. 4 schematically shows a current ($I_T$)–voltage ($V_T$) characteristic graph of the semiconductor device. As shown in FIG. 4, the semiconductor device behaviors as follows in a case where $V_T>0$ (i.e., a forward bias). Specifically, when $V_T$ is relatively small, the current $I_T$ is very small and nearly constant. When $V_T$ is larger than or equal to the critical voltage Vcrit and less than the punch-through voltage $V_{BO}$, the p-n-p-n semiconductor device may have two states of stable current at a same bias voltage, whereby the p-n-p-n semiconductor device can be used as a memory cell. When $V_T$ is larger than or equal to the punch-through voltage $V_{BO}$, the p-n-p-n semiconductor device shows a forward conductive state.

The semiconductor device behaviors as follows in a case where $V_T<0$ (i.e., a reverse bias). Specifically, when an absolute value of $V_T$ is relatively small, the reverse current $I_T$ is very small and nearly constant. When the absolute value of $V_T$ increases to a certain extent, the reverse current increases abruptly. In the following descriptions, a range of $V_T$ within which the current $I_T$ increases abruptly is referred to as a reverse breakdown region of the semiconductor device.

It is to be noted that the breakdown does not imply damage of the PN junction. In fact, when the reverse breakdown occurs, if the value of the reverse current is controlled not to be too large so as to cause overheat, the performance of the PN junction can recover when the reverse voltage is decreased.

As described above, the semiconductor device may have two states of stable current within a certain bias interval (e.g., an interval between the critical voltage Vcrit and the punch-through voltage $V_{BO}$), so the semiconductor device can be used as a memory cell, wherein the states of the stable current can be used to represent data states. For example, at a same bias, a state where the semiconductor device exhibits a relatively large stable current may represent data "1", while a state where the semiconductor device exhibits a relatively small stable current may represent data "0". However, those skilled in the art will understand that, at a same bias, a state where the semiconductor device exhibits a relatively small stable current may represent data "1", while a state where the semiconductor device exhibits a relatively large stable current may represent data "0".

Here, for example, a large forward voltage pulse (e.g., higher than the punch-through voltage $V_{BO}$) may be applied between the anode 200 and the cathode 300, to accumulate holes in the first P-type semiconductor layer 101 and accumulate electrons in the first N-type semiconductor layer 102 and thereby to forward bias the junction J1, and/or to accumulate holes in the second P-type semiconductor layer 103 and accumulate electrons in the second N-type semiconductor layer 104 and thereby to forward bias the junction J3. In this way, a relatively large stable current is generated when a bias between the critical voltage Vcrit and the punch-through voltage $V_{BO}$ is applied, to represent a corresponding data state such as "1". Further, a large reverse bias (approaching to the reverse breakdown region) may be applied between the anode 200 and the cathode 300, so that a large reverse current flows through the semiconductor device to effectively remove charges possibly existing in the semiconductor device. In this way, a relatively small stable current is generated when a bias between the critical voltage Vcrit and the punch-through voltage $V_{BO}$, to represent a corresponding data state such as "0".

Figure 5:
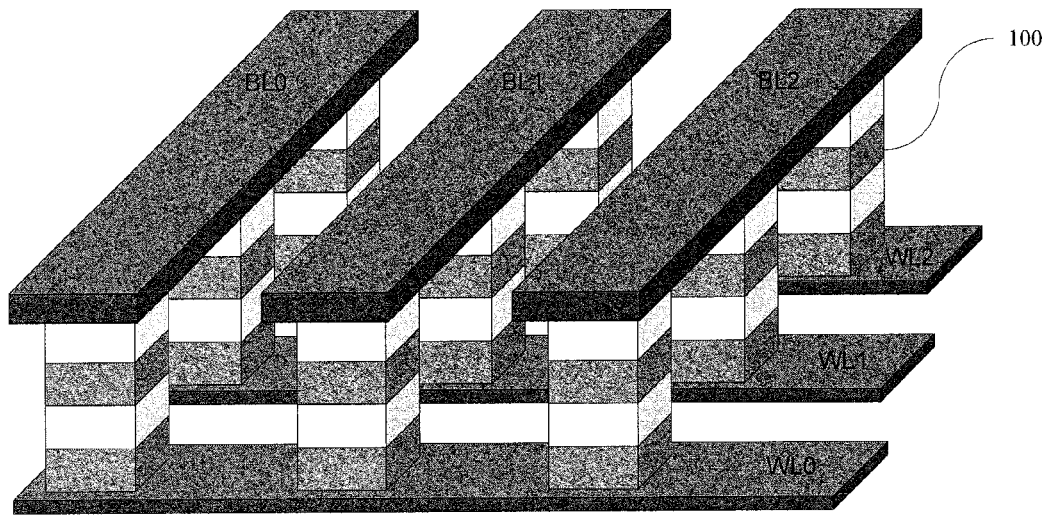
FIG. 5 schematically shows a semiconductor memory device incorporating the semiconductor devices according to an embodiment of the present disclosure.

FIG. 5 schematically shows an embodiment where the semiconductor device according to the present disclosure is used in a semiconductor memory device. In particular, as shown in FIG. 5, the memory device comprises an array of semiconductor devices 100 serving as memory cells. Each of the semiconductor devices 100 comprises a first P-type semiconductor layer, a first N-type semiconductor layer, a second P-type semiconductor layer, and second N-type semiconductor layer arranged in this order. Further, the memory device also comprises a plurality of word lines WL0, WL1, ..., WLn arranged in a first direction, wherein n is a natural number. Only three word lines are shown in the figure for clarity. The memory device further comprises a plurality of bit lines BL0, BL1, ... BLm arranged in a second direction different from the first direction (e.g., perpendicular to the first direction), wherein m is a natural number. Only three bit lines are shown in the figure for clarity. Each of the memory cells (semiconductor devices 100) is connected to a corresponding bit line BLi (i=0, 1, ..., m) and a corresponding word line WLj (j=0, 1, ..., n). For example, in the embodiment shown in FIG. 5, each of the memory cells (semiconductor devices 100) is at an intersection of a corresponding bit line BLi and a corresponding word line WLj, and has an anode connected to the bit line BLi and a cathode connected to the word line WLj. Those skilled in the art should understand that it is also possible to connect the anode of the memory cell to the word line WLj and to connect the cathode of the memory cell to the bit line BLi.

Those skilled in the art can devise various ways to manufacture the memory device shown in FIG. 5. For example, a metal layer may be deposited on a semiconductor substrate (on which associated circuits may be formed) and then patterned (e.g., by means of lithography), so as to form a plurality of word lines WL0, WL1, ..., WLn extending in a first direction. Next, a second N-type semiconductor layer, a second P-type semiconductor layer, a first N-type semiconductor layer, and a first P-type semiconductor layer are deposited in this order, and then patterned (e.g., by means of lithography) to form a plurality of stacks arranged in a matrix, which form corresponding semiconductor devices or memory cells, respectively. A further metal layer is then deposited and patterned (e.g., by means of lithography) to form a plurality of bit lines BL0, BL1, ..., BLm extending in a second direction. There may be a step of depositing an interlayer insulating layer between these steps. For example, after the word lines WL0, WL1, ..., WLn are formed, an insulating layer (not shown) may be deposited and then planarized to expose the word lines WL0, WL1, ..., WLn before the semiconductor layers are deposited. After the memory cells are formed, a further insulating layer (not shown) may be deposited and then planarized to expose the respective memory cells before the bit line layer is deposited.

It can be seen that the semiconductor memory device according to the present disclosure is easy to manufacture and compatible with the conventional Si semiconductor process, and thereby the manufacture cost may be greatly reduced.

In the foregoing embodiments, the word line layer is at the bottom side while the bit line layer is at the top side. However, those skilled in the art should understand that it is also possible to provide the bit line layer at the bottom side and provide the word line layer at the top side.

Figure 6:
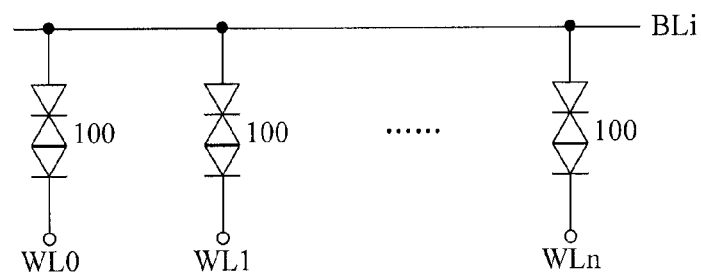
FIG. 6 schematically shows an equivalent circuit diagram of respective memory cells connected to a bit line in the semiconductor memory device shown in FIG. 5.

FIG. 6 schematically shows an equivalent circuit diagram of respective memory cells connected to a bit line BLi in the memory device shown in FIG. 5. As shown in FIG. 6, the respective memory cells 100 are connected between the bit line BLi and corresponding word lines WL0, WL1, ..., WLn, respectively. As described above, a large forward voltage pulse may be applied between the bit line BLi and the word line WLj, to store charges sufficient to forward bias the junction J1 and/or the junction J3 in the memory cell 100 connected between the bit line BLi and the word line WLj, and thereby corresponding data such as "1" is stored in the memory cell 100. Further, a large reverse bias may be applied between the bit line BLi and the word line WLj to remove charges possibly existing in the memory cell 100 connected between the bit line BLi and the word line WLj, and thereby corresponding data such as "0" is stored in the memory cell 100.

Further, when a memory cell 100 is to be read, a bias voltage (e.g., ≈Vcrit) between the critical voltage Vcrit and the punch-through voltage $V_{BO}$ may be applied between a corresponding bit line BLi and a corresponding word line WLj, and data stored in the memory cell 100 may be determined based on a current flowing through the memory cell 100. In particular, referring to the electrical characteristics of the semiconductor device shown in FIG. 4, at a bias voltage of Vcrit, if the current flowing through the memory cell 100 is relatively large (shown as I1 in FIG. 4), it can be determined that the memory cell 100 stores data such as "1"; while if the current flowing through the memory cell 100 is relatively small (shown as I0 in FIG. 4), it can be determined that the memory cell 100 stores data such as "0".

Optionally, a voltage bias slightly larger than the critical voltage Vcrit is applied between the bit line BLi and the word line WLj. In this way, the current flowing through the memory cell 100 will not change the charges stored in the memory cell to maintain the data stored therein.

The present disclosure has been explained with reference to the embodiments thereof. However, these embodiments are only illustrative rather than limiting the scope of the disclosure. The scope of the disclosure is defined by the attached claims and equivalents thereof. Those skilled in the art can make various substitutions and modifications without departing from the scope of the present disclosure.

We claim:

1. A two-terminal memory cell including an anode terminal and a cathode terminal, the memory cell comprising:
    a first P-type semiconductor layer, a first N-type semiconductor layer, a second P-type semiconductor layer, and a second N-type semiconductor layer arranged in sequence,
    wherein the first P-type semiconductor layer forms the anode terminal and the second N-type semiconductor layer forms the cathode terminal,
    wherein the memory cell is configured to exhibit different states of stable current flowing from the anode terminal to the cathode terminal at a same bias voltage across the anode terminal and the cathode terminal based on different data states stored therein, the data states include a first data state where the memory cell exhibits a relatively large stable current at the bias voltage, wherein the first data state is stored in the memory cell by applying a forward bias, which is larger than a punch-through voltage $V_{BO}$, between the first P-type semiconductor layer and the second N-type semiconductor layer, and a second data state where the memory cell exhibits a relatively small stable current at the bias voltage, wherein the second data state is stored in the memory cell by applying a reverse bias, which is approaching to a reverse breakdown region of the memory cell, between the first P-type semiconductor layer and the second N-type semiconductor layer.

2. A semiconductor memory device, comprising:
    an array of two-terminal memory cells, wherein each memory cell comprises:
        a first P-type semiconductor layer, a first N-type semiconductor layer, a second P-type semiconductor layer, and a second N-type semiconductor layer arranged in sequence,
        wherein the first P-type semiconductor layer forms an anode terminal and the second N-type semiconductor layer forms a cathode terminal, and
        wherein the memory cell is configured to exhibit different states of stable current flowing from the anode terminal to the cathode terminal at a same bias voltage across the anode terminal and the cathode terminal based on different data states stored therein, the data states include a first data state where the memory cell exhibits a relatively large stable current at the bias voltage, wherein the first data is written into a memory cell connected to a bit line and a word line by applying a forward bias, which is larger than a punch-through voltage $V_{BO}$, on the memory cell via the hit line and the word line, and a second data state where the memory cell exhibits a relatively small stable current at the bias voltage, wherein the second data is written into a memory cell connected to a bit line and a word line by applying a reverse bias, which is approaching to a reverse breakdown region of the memory cell, on the memory cell via the bit line and the word line;

a plurality of word lines arranged in a first direction; and a plurality of bit lines arranged in a second direction different from the first direction, wherein each memory cell is connected to a corresponding word line and a corresponding bit line.

3. The semiconductor memory device according to claim 2, wherein the data state stored in a memory cell connected to a bit line and a word line is read by applying a read bias, which is larger than a critical voltage Vcrit and less than the punch-through voltage $V_{BO}$, on the memory cell via the bit line and the word line, and wherein it is determined that the first data state is stored in the memory cell if a current flowing through the memory cell is relatively large.

4. The semiconductor memory device according to claim 2, wherein the data state stored in a memory cell connected to a bit line and a word line is read by applying a read bias, which is larger than a critical voltage Vcrit and less than the punch-through voltage $V_{BO}$, on the memory cell via the bit line and the word line, and wherein it is determined that the second data state is stored in the memory cell if the current flowing through the memory cell is relatively small.

\* \* \* \* \*